US008895944B2

(12) United States Patent
McRay

(10) Patent No.: US 8,895,944 B2
(45) Date of Patent: Nov. 25, 2014

(54) SCAN HEAD AND SCAN ARM USING THE SAME

(71) Applicant: Advanced Ion Beam Technology, Inc., Fremont, CA (US)

(72) Inventor: Richard F. McRay, Penn Valley, CA (US)

(73) Assignee: Advanced Ion Beam Technology, Inc., Fremont, CA (US)

( * ) Notice: Subject to any disclaimer, the term of this patent is extended or adjusted under 35 U.S.C. 154(b) by 174 days.

(21) Appl. No.: 13/745,426

(22) Filed: Jan. 18, 2013

(65) Prior Publication Data

US 2013/0187349 A1 Jul. 25, 2013

Related U.S. Application Data

(60) Provisional application No. 61/589,189, filed on Jan. 20, 2012.

(51) Int. Cl.
| *H01J 37/317* | (2006.01) |
| *H01J 37/20* | (2006.01) |
| *H01L 21/683* | (2006.01) |
| *H01L 21/687* | (2006.01) |

(52) U.S. Cl.
CPC ...... *H01L 21/6831* (2013.01); *H01L 21/68764* (2013.01)
USPC .............. 250/492.21; 250/491.1; 250/442.11; 279/128

(58) Field of Classification Search
CPC .................. H01J 37/3171; H01J 2237/20228; H01J 37/20; H01L 21/67259; H01L 21/6831; H01L 21/68742; H01L 21/68764
USPC .............. 250/492.21, 491.1, 442.11; 279/128
See application file for complete search history.

(56) References Cited

U.S. PATENT DOCUMENTS

| 7,057,192 B2 * | 6/2006 | Kaim et al. ............... 250/492.21 |
| 8,519,363 B2 * | 8/2013 | Tanaka et al. .............. 250/491.1 |
| 8,592,786 B2 * | 11/2013 | Suuronen et al. ........ 250/492.21 |

* cited by examiner

*Primary Examiner* — Nikita Wells
(74) *Attorney, Agent, or Firm* — Muncy, Geissler, Olds & Lowe, P.C.

(57) ABSTRACT

A scan head assembled to a scan arm for an ion implanter and a scan arm using the same are provided, wherein the scan head is capable of micro tilting a work piece and comprises a case, a shaft assembly, an electrostatic chuck, a first driving mechanism and a micro-tilt mechanism. The shaft assembly passes through a first side of the case and has a twist axis. The electrostatic chuck is fastened on a first end of the shaft assembly outside the case for holding the work piece. The first driving mechanism is disposed within the case and capable of driving the shaft assembly and the ESC to rotate about the twist axis. The micro-tilt mechanism is disposed within the case and capable of driving the shaft assembly and the ESC to tilt relative to the case.

31 Claims, 5 Drawing Sheets

SCAN HEAD AND SCAN ARM USING THE SAME

CROSS-REFERENCE TO RELATED APPLICATIONS

This application claims priority to and the benefit of U.S. provisional Application Ser. No. 61/589,189, filed Jan. 20, 2012, the entire contents of which are incorporated herein by reference.

FIELD OF THE INVENTION

The present invention generally relates to a scan arm, and more particularly to a scan arm for an ion implanter.

DESCRIPTION OF THE RELATED ART

Scan arm, an important driving device of an ion implanter, is mainly used to bring a work piece, such as a wafer, held on an electrostatic chuck (ESC) of the scan arm to move during an ion implantation process, so as to enable the wafer to be scanned with an ion beam provided by the ion implanter. A conventional scan arm is usually composed of a horizontal arm fixed within a chamber of the ion implanter, a swing arm, a swing driver for driving the swing arm to swing about the horizontal arm, a scan head with the ESC and a rotation driver for driving the scan head to rotate about the swing arm. During an ion implantation process, the work piece can be moved horizontally relative to the ion beam as the swing arm is swung by the swing driver, while the work piece can further be tilted relative to the ion beam as the scan head is rotated by the rotation driver, so as to enable whole or part of the work piece to be completely scanned by the ion beam.

In the conventional scan arm, it is necessary to rotate whole of the scan head in order to tilt the work piece. However, in order to rotate whole of the scan head, it is necessary to use a motor with a larger driving power, and thus it unavoidable consumes more energy and responds slower for tilting the scan head. In addition, the rotation driver can only drive the scan head to tilt in a plane rather than any direction, for example, the rotation driver can only drive the scan head to tilt upward or downward as the ESC vertically holds the work piece. Furthermore, it is not only difficult to drive the scan head to tilt with a tiny angle, such as 2 degrees or smaller, but also impossible to precisely align the ion beam with a desired angle by using such a mechanism.

SUMMARY OF THE INVENTION

The present invention is directed to a scan head with a micro-tilt mechanism and a scan arm using the same.

The present invention provides a scan head assembled to a scan arm for an ion implanter, wherein the scan head is capable of micro tilting a work piece and comprises a case, a shaft assembly, an electrostatic chuck, a first driving mechanism and a micro-tilt mechanism. The shaft assembly passes through a first side of the case and has a twist axis. The electrostatic chuck is fastened on a first end of the shaft assembly outside the case for holding the work piece. The first driving mechanism is disposed within the case and capable of driving the shaft assembly and the ESC to rotate about the twist axis. The micro-tilt mechanism is disposed within the case and capable of driving the shaft assembly and the ESC to tilt relative to the case.

According to an embodiment of the present invention, the micro-tilt mechanism comprises a frame assembly, a pair of lead screws, a pair of first motors, a pair of gear racks, a jacket pipe and a control gear. The frame assembly is fastened on a bottom of a housing of the case and having a guide shaft. The lead screws pass through the frame assembly and parallel to the guide shaft. The first motors are fastened on the bottom and capable of driving the lead screws to rotate respectively. Each of the gear racks has a threaded hole and a plurality of first teeth, and the threaded holes engage with the lead screws. The jacket pipe glidingly fits around the guide shaft and has a pivot. The control gear has a shaft bore, a shifting hole and a plurality of second teeth, wherein the shaft bore is located at a center of the control gear and fits around the pivot, the shifting hole is deviated from the center and fits around the shaft assembly, and the second teeth are located on a circumference of the control gear and engaged with the first teeth, and thus the control gear is engaged between the gear racks.

According to an embodiment of the present invention, the frame assembly further has two end plates disposed on two opposite ends of the guide shaft, and the first motors are disposed at one of two outer sides of the end plates, wherein two first shafts of the first motors pass through one of the end plates, and the lead screws pass through the other one of the end plates.

According to an embodiment of the present invention, each of the gear racks comprises a gear portion and a nut portion, wherein the first teeth are located on a first side surface of the gear portion facing toward the control gear, and the nut portion protrudes from the first side surface and having the threaded holes.

According to an embodiment of the present invention, each of the nut portions has two opposite end surfaces and a plurality of slits, wherein the threaded hole passes through the end surfaces, and the slits alternately extend from the end surfaces.

According to an embodiment of the present invention, the gear portion further has a second side surface opposite to the first side surface, a first cavity formed on the second side surface and corresponding to the nut portion and a second cavity formed on the second side surface and distant from the first cavity, and each of the gear racks further comprises a first plunger, a first spring, a second plunger and a second spring. The first plunger glidingly fits into the first cavity. The first spring is compressed between a bottom of the first cavity and the first plunger, so as to lean the first plunger against an inner surface of the housing. The second plunger glidingly fits into the second cavity. The second spring is compressed between a bottom of the second cavity and the second plunger, so as to lean the second plunger against the inner surface of the housing.

According to an embodiment of the present invention, the shaft assembly further has a second end opposite to the first end, and the shifting hole fits around the second end.

According to an embodiment of the present invention, the micro-tilt mechanism further comprises a clamp for fastening the first motors on the bottom.

According to an embodiment of the present invention, the micro-tilt mechanism further comprises a pair of couplings respectively coupling the lead screws with two first shafts of the first motors.

According to an embodiment of the present invention, the micro-tilt mechanism further comprises a pair of encoders, the first motors couple to an end of the lead screws, and the encoders fit onto the other end of the lead screws.

According to an embodiment of the present invention, the first driving mechanism comprises a gimbal assembly and a second motor, wherein the gimbal assembly fits around the shaft assembly, so as to provide a tilt center for the shaft assembly, while the second motor is engaged with the gimbal assembly, so that the second motor is capable of driving the gimbal assembly, the shaft assembly and the ESC to rotate about the twist axis.

According to an embodiment of the present invention, the gimbal assembly is located between the ESC and the micro-tilt mechanism.

According to an embodiment of the present invention, the gimbal assembly comprises an inner ring, a middle ring and an outer ring, wherein the inner ring fits around the shaft assembly, the middle ring is pivoted around the inner ring by a pair of first pivot shafts, and the outer ring fits within the case body via a bearing and is pivoted around the middle ring by a pair of second pivot shafts perpendicular to the first pivot shafts.

According to an embodiment of the present invention, the case comprises a case body having the first side and a second side opposite to the first side, a cover covering the first side and a housing covering the second side, wherein the first driving mechanism is disposed within the case body, and the micro-tilt mechanism is disposed within the housing.

According to an embodiment of the present invention, a second motor of the first driving mechanism is fastened on a bottom of a housing of the case.

The present invention further provides a scan arm for an ion implanter comprising the above-mentioned scan head, a swing arm, a second driving mechanism, a horizontal arm and a third driving mechanism. The second driving mechanism connects between the scan head and the swing arm, and is capable of driving the scan head to rotate about a tilt axis perpendicular to the twist axis. The third driving mechanism connects between the swing arm and the horizontal arm, and is capable of driving the swing arm to swing about a horizontal axis.

According to an embodiment of the present invention, a center line of the ESC is coincided with the twist axis.

Accordingly, the scan arm can tilt the work piece clamped on the ESC not only via the driving mechanism in only two opposite directions, but also via the micro-tilt mechanism in any orientation.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations are not described in detail in order not to obscure the present invention.

Figure 1:
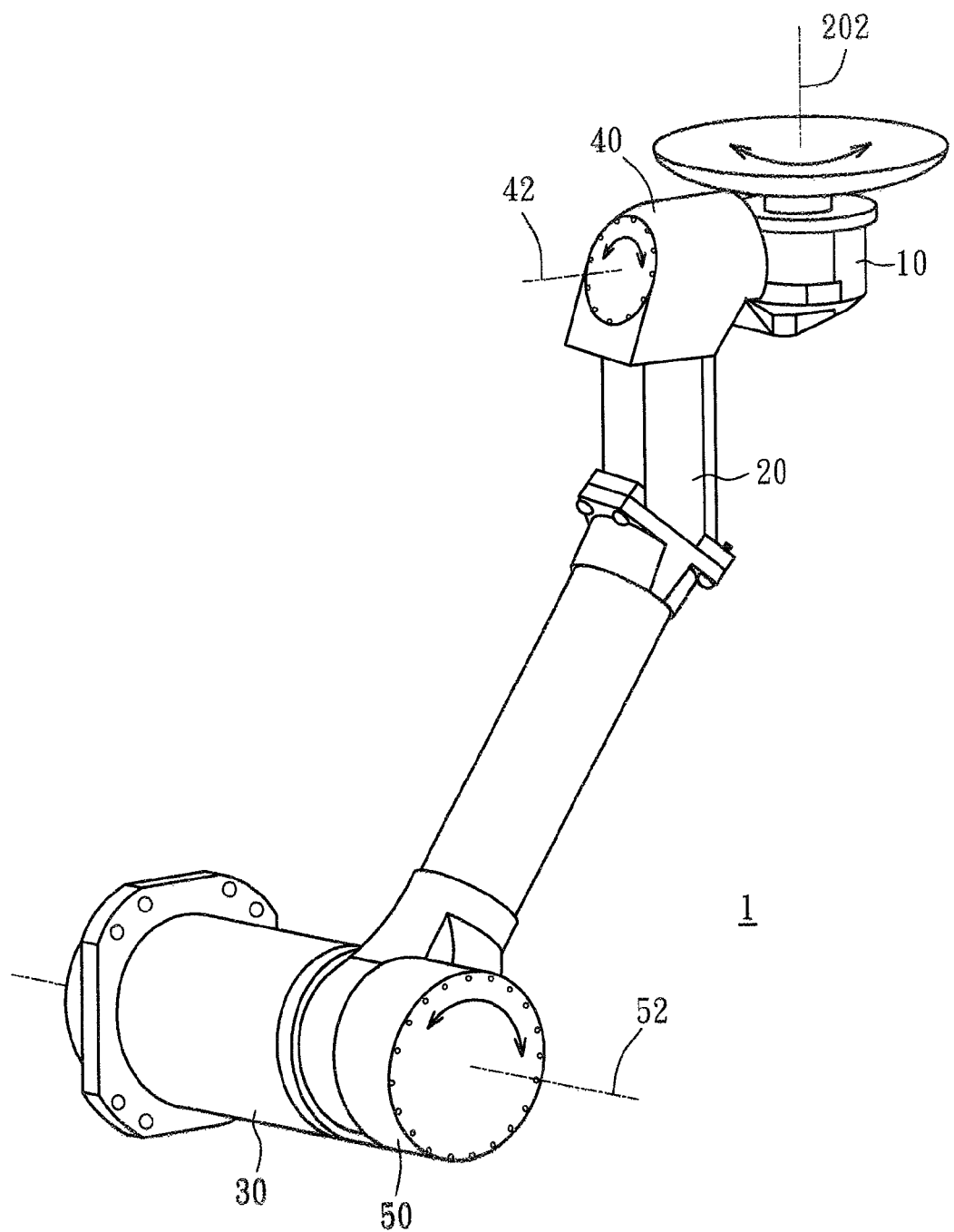
FIG. 1 illustrates a perspective view of a scan arm according to an embodiment of the present invention.
Figure 2:
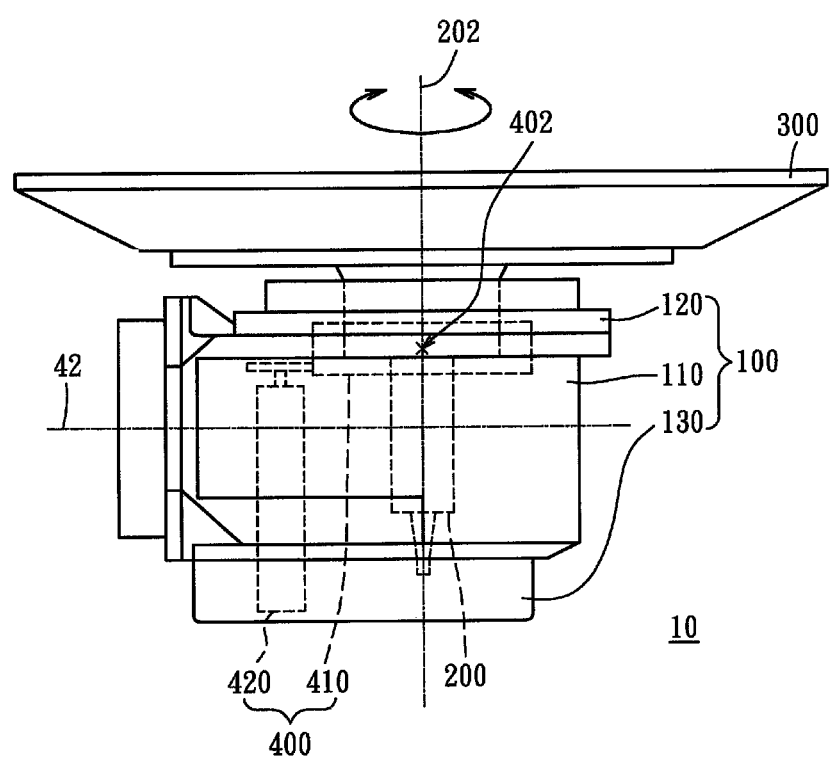
FIG. 2 illustrates a front view of the scan head as illustrated in FIG. 1.
Figure 3:
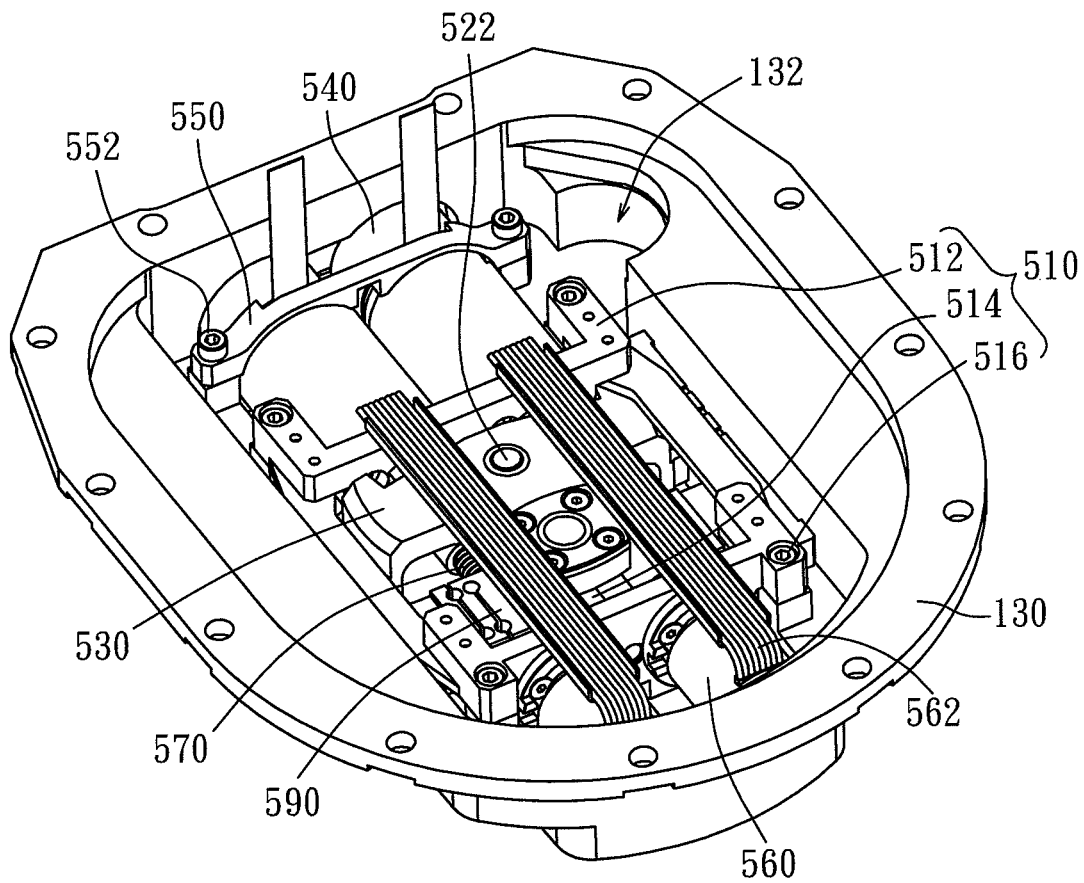
FIG. 3 illustrates a perspective view of the micro-tilt mechanism arranged within the housing as illustrated in FIG. 1.
Figure 4:
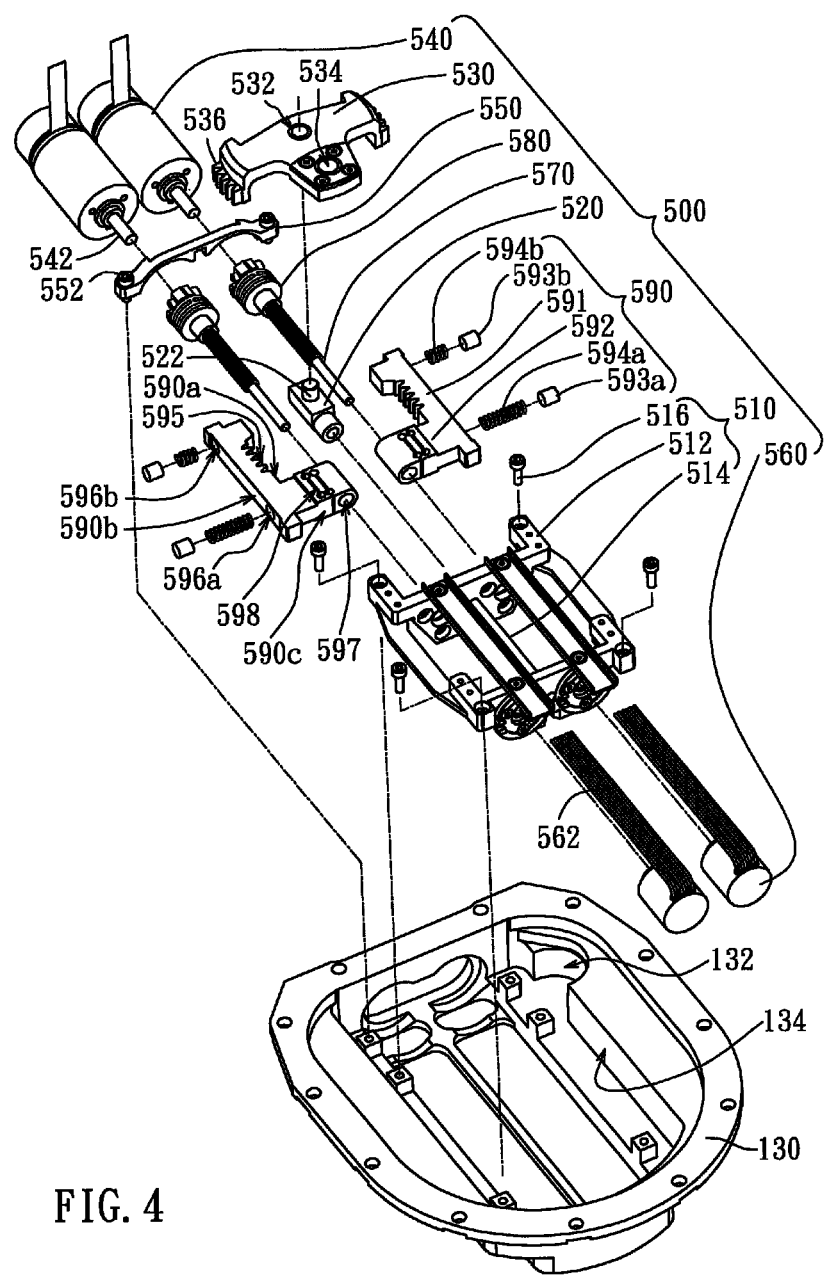
FIG. 4 illustrates an explosion view of the micro-tilt mechanism and the housing as illustrated in FIG. 3.
Figure 5:
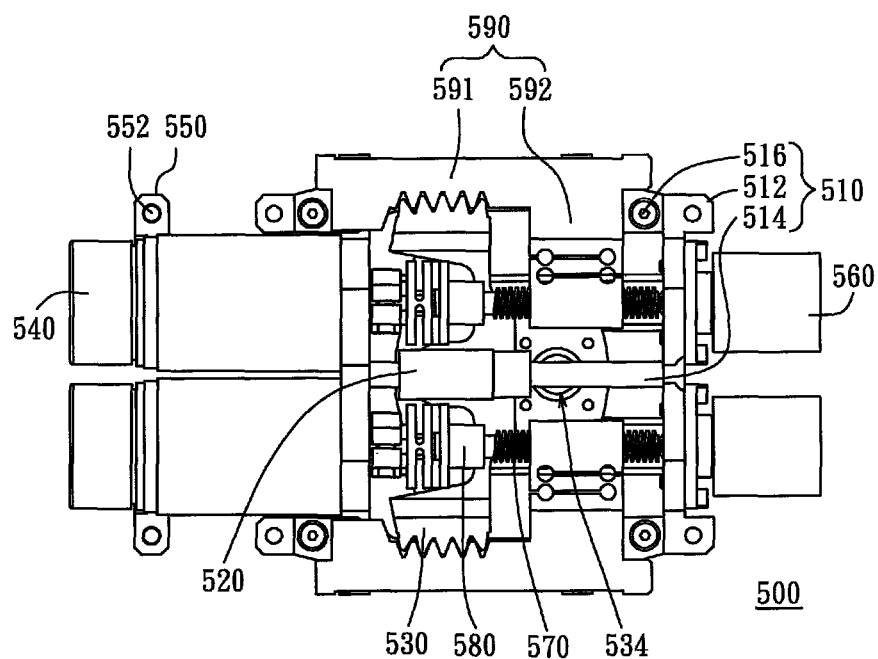
FIG. 5 illustrates a bottom view of the micro-tilt mechanism as illustrated in FIG. 3.

FIG. 1 illustrates a perspective view of a scan arm according to an embodiment of the present invention. In addition, FIG. 2 illustrates a front view of the scan head as illustrated in FIG. 1, while FIG. 3 illustrates a perspective view of the micro-tilt mechanism arranged within the housing as illustrated in FIG. 1. Besides, FIG. 4 illustrates an explosion view of the micro-tilt mechanism and the housing as illustrated in FIG. 3, while FIG. 5 illustrates a bottom view of the micro-tilt mechanism as illustrated in FIG. 3. Referring to FIG. 1 first, a scan arm 1 for an ion implanter is capable of bringing a work piece (not shown), such as a wafer, to move during an ion implantation process and comprises a scan head 10, a swing arm 20, a horizontal arm 30 and two driving mechanisms 40 and 50. In the present embodiment, the driving mechanism 40 connects between the scan head 10 and the swing arm 20 and is capable of driving the scan head 10 to rotate about a tilt axis 42 perpendicular to a twist axis 202 of the scan head 10, so as to adjust an angle of the twist axis 202. In contrast, the driving mechanism 50 connects between the swing arm 20 and the horizontal arm 30 and is capable of driving the swing arm 20 to swing about a horizontal axis 52, so as to adjust an angle of the tilt axis 42.

Moreover, referring to FIG. 1 and FIG. 2 together, the scan head 10 comprises a case 100, a shaft assembly 200, an ESC 300, a driving mechanism 400 and a micro-tilt mechanism 500 (as shown in FIG. 5). The case 100 comprises a case body 110, a cover 120 and a housing 130, wherein the cover 120 covers a top side of the case body 110, while the housing 130 covers a bottom side of the case body 110. The shaft assembly 200 passes through the cover 120 and has the twist axis 202. The ESC 300 is fastened on a top end of the shaft assembly 200 and located outside the case 100 for holding the work piece, and a center line of the ESC 300 is coincided with the twist axis 202. The driving mechanism 400 is disposed within the case body 110 and capable of driving the shaft assembly 200 and the ESC 300 to rotate about the twist axis 202. In addition, the micro-tilt mechanism 500 is disposed within the housing 130 and capable of driving the shaft assembly 200 and the ESC 300 to tilt relative to the case 100. Therefore, when the twist axis 202 is horizontal during the ion implantation process, the driving mechanism 40 can drive the scan head 10 to tilt the work piece clamped on the ESC 300 upward or downward, and the micro-tilt mechanism 500 can drive the work piece and the ESC 300 to tilt upward, downward, leftward or rightward within limited angles, so as to adjust an incident angle of an ion beam. In contrast, the driving mechanism 400 can drive the work piece and the ESC 300 to rotate, so as to adjust an incident location of the ion beam.

In a preferred embodiment, referring to FIG. 2, the driving mechanism 400 comprises a gimbal assembly 410 and a motor 420, wherein the gimbal assembly 410 is located between the ESC 300 and the micro-tilt mechanism 500, and the motor 420 is fastened within a dent portion 132 (as shown in FIG. 3) formed on a bottom of the housing 130 and engaged with the gimbal assembly 410 via a gear set or a drive belt (not shown). In addition, the gimbal assembly 410 is assembled by three concentric rings (not shown), wherein an inner ring fits around the shaft assembly 200, a middle ring is pivoted around the inner ring by a pair of first pivot shafts and is pivoted inside an outer ring by a pair of second pivot shafts perpendicular to the first pivot shafts, and the outer ring further fits within the case body 110 via a bearing (not shown). In a word, the gimbal assembly 410 provides a tilt center 402 for the shaft assembly 200. Therefore, the gimbal assembly 410 is capable of not only rotating about the twist axis 202 driven by the motor 420, but also tilting relative to the tilt center 402 driven by the micro-tilt mechanism 500. During the operation, the vacuum in which the ESC 300 operates is sealed from the atmospheric pressure inside housing 100 by the use of a spherical differentially pumped seal operating around the tilt center 402 (pivot center), or a bellows or other means which will allow tilting of shaft assembly 200 without leakage.

Next, the detail structures of the micro-tilt mechanism 500 of the present embodiment are illustrated hereinafter. Referring to FIG. 3 to FIG. 5 together, the micro-tilt mechanism 500 comprises a frame assembly 510, a jacket pipe 520, a control gear 530, a pair of motors 540, a clamp 550, a pair of encoders 560, a pair of lead screws 570, a pair of couplings 580 and a pair of gear racks 590. In the present embodiment, the frame assembly 510 mainly comprises two end plates 512 and a guide shaft 514, wherein the end plates 512 are fastened on the bottom of the housing 130 with a plurality of screws 516 and disposed on two opposite ends of the guide shaft 514.

Furthermore, the jacket pipe 520 glidingly fits around the guide shaft 514 and has a pivot 522 extending from a top surface of the jacket pipe 520 and perpendicular to the guide shaft 514. Moreover, the control gear 530 has a shaft bore 532, a shifting hole 534 and a plurality of teeth 536, wherein the shaft bore 532 is located at a center of the control gear 530 and fits around the pivot 522, the shifting hole 534 is deviated from the center of the control gear 530 and fits around a bottom end of the shaft assembly 200, and the teeth 536 are located on a circumference of the control gear 530. In the present embodiment, the control gear 530 is substantially formed as a rectangle with two opposite arc ends and a protrusion protruding from another side end connected between the two arc ends. The shaft bore 532 is located at a center of the rectangular, the shifting hole 534 is located at a center of protrusion, and the teeth 536 are located on the arc ends.

Moreover, the motors 540 are fastened on the bottom of the housing 130 by the clamp 550 with a plurality of screws 552, the motors 540 and the encoders 560 are disposed at two opposite outer sides of the frame assembly 510, and the lead screws 570 and the couplings 580 connect between the motors 540 and the encoders 560 and are parallel to the guide shaft 514. In another word, two shafts 542 of the motors 540 pass through one of the end plates 512 from the outer side of the frame assembly 510 to respectively couple with the lead screws 570 with the couplings 580, and the lead screws 570 pass through the other one of the end plates 512 from the inner side of the frame assembly 510 to respectively fit into the encoders 560.

In addition, in the present embodiment, each of the gear racks 590 comprises a gear portion 591, a nut portion 592, two plungers 593a and 593b and two springs 594a and 594b. The gear portion 591 has a first side surface 590a facing toward the control gear 530, a second side surface 590b opposite to the first side surface 590a, a plurality of teeth 595 located on the first side surface 590a, and two cavities 596a and 596b formed on the second side surface 590b. Herein, the control gear 530 is engaged between the two gear racks 590 due to the teeth 595 of the two gear racks 590 respectively engage with the teeth 532 located on the two arc ends of the control gear 530. Further, the nut portion 592 protrudes from the first side surface 590a and has two opposite end surfaces 590c, a threaded hole 597 and a plurality of slits 598, wherein the end surfaces 590c are perpendicular to the first side surface 590a, the threaded hole 597 passes through the end surfaces 590c and is capable of engaging with one of the lead screws 570, and the slits 598 alternately extend from the end surfaces 590c, so as to form as a buffer.

Besides, a location of the cavity 596a corresponds to the nut portion 592, the plunger 593a glidingly fits into the cavity 596a and the spring 594a is compressed between a bottom of the cavity 596a and the plunger 593a. Therefore, the plunger 593a leans against an inner surface 134 of the housing 130 due to the spring 594a being preloaded. In contrast, a location of the cavity 596b is distant from the cavity 596a, the plunger 593b glidingly fits into the cavity 596b and the spring 594b is compressed between a bottom of the cavity 596b and the plunger 593b. Therefore, the plunger 593b also leans against the inner surface 134 due to the spring 594b being preloaded.

Referring to FIG. 2 and FIG. 3, a principle of how the micro-tilt mechanism 500 of the present preferred embodiment tilting the shaft assembly 200 relative to the tilt center 402 is described hereinafter. According to the above mentioned structure, the encoders 560 can provide the position information (such as the present orientations) of the lead screws 570 to a proportional-integral-derivative controller (PID controller, not shown) through two leads 562 of the encoders 560 during an ion implantation process. Next, the PID controller calculates required rotation angles of the lead screws 570 and then respectively operates the motors 540 to drive the lead screws 570 to rotate clockwise or counterclockwise according to the position information, and then the lead screws 570 drive the control gear 530 to translate and/or rotate to a required position via the gear racks 590. Hence, the desired position of the shifting hole 534 is achieved, so as to tilt the shaft assembly 200 and the ESC 300 with a desired angle. In a preferred embodiment, the control gear 530 can further comprise a spherical bearing (not shown) equipped within the shafting hole 534, so as to accommodate the shafting hole 534 to the resulting angle of shaft assembly 200.

For example, in the present embodiment, when both of the motors 540 drive the lead screws 570 to rotate clockwise (according to the orientation of FIG. 3), the gear racks 590 are moved toward the encoders 560. In such an instance, the gear racks 590 drive the control gear 530 to move toward the encoders 560 via the engagement of the teeth 536 and the teeth 595 and the guidance of the jacket pipe 520 and the guide shaft 514, and thus both of the shaft assembly 200 and the ESC 300 are tilted counterclockwise (according to the orientation of FIG. 2) relative to the tilt center 402. On the contrary, when both of the motors 540 drive the lead screws 570 to rotate counterclockwise (according to the orientation of FIG. 3), the gear racks 590 are moved toward the motors 540. In the instance, the gear racks 590 drive the control gear 530 to move toward the motors 540, and thus both of the shaft assembly 200 and the ESC 300 are tilted clockwise (according to the orientation of FIG. 2) relative to the tilt center 402.

In contrast, when the left motor 540 drives the left lead screw 570 to rotate clockwise and the right motor 540 drives the right lead screw 570 to rotate counterclockwise (according to the orientation of FIG. 3), the left gear rack 590 is moved toward the left encoder 560 and the right gear rack 590 is moved toward the right motor 540. In such an instance, the gear racks 590 drive the control gear 530 to rotate counterclockwise, so that the ESC 300 is tilted toward a direction pointing out of the paper (according to the orientation of FIG. 2). On the contrary, the ESC 300 is tilted toward a direction pointing into the paper when the motors 540 drive the lead screws 570 to rotate in contrary directions. Hence, the micro-tilt mechanism 500 can tilt the ESC 300 in any desired orientation with a desired angle, so as to adjust the incident angle of the ion beam during the ion implantation process.

In summary, in the present invention, the scan arm 1 can tilt the work piece clamped on the ESC 300 not only via the driving mechanism 40 in only two opposite directions, but also via the micro-tilt mechanism 500 in any orientation. Furthermore, since the driving mechanism 40 drives whole of the scan head 10 to tilt but the micro-tilt mechanism 500 drives only a part of the scan head 10 (such as the shaft assembly 200 and the ESC 300) to tilt and applies the leverage theory, the micro-tilt mechanism 500 has various advantages more than the driving mechanism 40, such as saving more energy, responding quicker and achieving tinier motions. Moreover, a back lash generated between the nut portion 592 and the lead screw 590 when the gear rack 590 is moved related to the lead screw 590 is reduced by the slits 598 and the spring 594a. In contrast, a back lash generated between the gear portion 591 and the control gear 530 when the gear portion 591 is moved related to the control gear 530 is reduced by the spring 594b.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A scan head, assembled to a scan arm for an ion implanter, and capable of micro tilting a work piece, comprising:
   a case;
   a shaft assembly, passing through a first side of the case and having a twist axis;
   an electrostatic chuck, fastened on a first end of the shaft assembly outside the case for holding the work piece;
   a first driving mechanism, disposed within the case and capable of driving the shaft assembly and the ESC to rotate about the twist axis; and
   a micro-tilt mechanism, disposed within the case and capable of driving the shaft assembly and the ESC to tilt relative to the case.

2. The scan head as claimed in claim 1, wherein the micro-tilt mechanism comprises:
   a frame assembly, fastened on a bottom of a housing of the case and having a guide shaft;
   a pair of lead screws, passing through the frame assembly and parallel to the guide shaft;
   a pair of first motors, fastened on the bottom and capable of driving the lead screws to rotate respectively;
   a pair of gear racks, wherein each of the gear racks has a threaded hole and a plurality of first teeth, and the threaded holes engage with the lead screws;
   a jacket pipe, glidingly fitting around the guide shaft and having a pivot; and
   a control gear, having a shaft bore, a shifting hole and a plurality of second teeth, wherein the shaft bore is located at a center of the control gear and fits around the pivot, the shifting hole is deviated from the center and fits around the shaft assembly, and the second teeth are located on a circumference of the control gear and engaged with the first teeth, and thus the control gear is engaged between the gear racks.

3. The scan head as claimed in claim 2, wherein the frame assembly further has two end plates disposed on two opposite ends of the guide shaft, the first motors are disposed at one of two outer sides of the end plates, two first shafts of the first motors pass through one of the end plates, and the lead screws pass through the other one of the end plates.

4. The scan head as claimed in claim 2, wherein each of the gear racks comprises:
   a gear portion, wherein the first teeth are located on a first side surface of the gear portion facing toward the control gear; and
   a nut portion, protruding from the first side surface and having the threaded holes.

5. The scan head as claimed in claim 4, wherein each of the nut portions has two opposite end surfaces and a plurality of slits, the threaded hole passes through the end surfaces, and the slits alternately extend from the end surfaces.

6. The scan head as claimed in claim 4, wherein the gear portion further has a second side surface opposite to the first side surface, a first cavity formed on the second side surface and corresponding to the nut portion and a second cavity formed on the second side surface and distant from the first cavity, and each of the gear racks further comprises:
   a first plunger, glidingly fitting into the first cavity;
   a first spring, compressed between a bottom of the first cavity and the first plunger, so as to lean the first plunger against an inner surface of the housing;
   a second plunger, glidingly fitting into the second cavity; and
   a second spring, compressed between a bottom of the second cavity and the second plunger, so as to lean the second plunger against the inner surface of the housing.

7. The scan head as claimed in claim 2, wherein the shaft assembly further has a second end opposite to the first end, and the shifting hole fits around the second end.

8. The scan head as claimed in claim 2, wherein the micro-tilt mechanism further comprises a clamp for fastening the first motors on the bottom.

9. The scan head as claimed in claim 2, wherein the micro-tilt mechanism further comprises a pair of couplings respectively coupling the lead screws with two first shafts of the first motors.

10. The scan head as claimed in claim 2, wherein the micro-tilt mechanism further comprises a pair of encoders, the first motors couple to an end of the lead screws, and the encoders fit onto the other end of the lead screws.

11. The scan head as claimed in claim 1, wherein the first driving mechanism comprises:
    a gimbal assembly, fitting around the shaft assembly, so as to provide a tilt center for the shaft assembly; and
    a second motor, engaged with the gimbal assembly, so that the second motor is capable of driving the gimbal assembly, the shaft assembly and the ESC to rotate about the twist axis.

12. The scan head as claimed in claim 11, wherein the gimbal assembly is located between the ESC and the micro-tilt mechanism.

13. The scan head as claimed in claim 11, wherein the gimbal assembly comprises:
    an inner ring, fitting around the shaft assembly;
    a middle ring, pivoted around the inner ring by a pair of first pivot shafts; and
    an outer ring, fitting within the case body via a bearing and pivoted around the middle ring by a pair of second pivot shafts perpendicular to the first pivot shafts.

14. The scan head as claimed in claim 1, wherein the case comprises:
    a case body, having the first side and a second side opposite to the first side;
    a cover, covering the first side, wherein the first driving mechanism is disposed within the case body; and
    a housing, covering the second side, wherein the micro-tilt mechanism is disposed within the housing.

15. The scan head as claimed in claim 1, wherein a second motor of the first driving mechanism is fastened on a bottom of a housing of the case.

16. A scan arm for an ion implanter comprising:
a scan head, capable of micro tilting a work piece and comprising:
a case;
a shaft assembly, passing through a first side of the case and having a twist axis;
an electrostatic chuck, fastened on a first end of the shaft assembly outside the case for holding the work piece;
a first driving mechanism, disposed within the case and capable of driving the shaft assembly and the ESC to rotate about the twist axis; and
a micro-tilt mechanism, disposed within the case and capable of driving the shaft assembly and the ESC to tilt relative to the case;
a swing arm;
a second driving mechanism, connected between the scan head and the swing arm and capable of driving the scan head to rotate about a tilt axis perpendicular to the twist axis;
a horizontal arm; and
a third driving mechanism, connected between the swing arm and the horizontal arm and capable of driving the swing arm to swing about a horizontal axis.

17. The scan arm as claimed in claim 16, wherein the micro-tilt mechanism comprises:
a frame assembly, fastened on a bottom of a housing of the case and having a guide shaft;
a pair of lead screws, passing through the frame assembly and parallel to the guide shaft;
a pair of first motors, fastened on the bottom and capable of driving the lead screws to rotate respectively;
a pair of gear racks, wherein each of the gear racks has a threaded hole and a plurality of first teeth, and the threaded holes engage with the lead screws;
a jacket pipe, glidingly fitting around the guide shaft and having a pivot; and
a control gear, having a shaft bore, a shifting hole and a plurality of second teeth, wherein the shaft bore is located at a center of the control gear and fits around the pivot, the shifting hole is deviated from the center and fits around the shaft assembly, and the second teeth are located on a circumference of the control gear and engaged with the first teeth, and thus the control gear is engaged between the gear racks.

18. The scan arm as claimed in claim 17, wherein the frame assembly further has two end plates disposed on two opposite ends of the guide shaft, the first motors are disposed at one of two outer sides of the end plates, two first shafts of the first motors pass through one of the end plates, and the lead screws pass through the other one of the end plates.

19. The scan arm as claimed in claim 17, wherein each of the gear racks comprises:
a gear portion, wherein the first teeth are located on a first side surface of the gear portion facing toward the control gear; and
a nut portion, protruding from the first side surface and having the threaded holes.

20. The scan arm as claimed in claim 19, wherein each of the nut portions has two opposite end surfaces and a plurality of slits, the threaded hole passes through the end surfaces, and the slits alternately extend from the end surfaces.

21. The scan arm as claimed in claim 19, wherein the gear portion further has a second side surface opposite to the first side surface, a first cavity formed on the second side surface and corresponding to the nut portion and a second cavity formed on the second side surface and distant from the first cavity, and each of the gear racks further comprises:
a first plunger, glidingly fitting into the first cavity;
a first spring, compressed between a bottom of the first cavity and the first plunger, so as to lean the first plunger against an inner surface of the housing;
a second plunger, glidingly fitting into the second cavity; and
a second spring, compressed between a bottom of the second cavity and the second plunger, so as to lean the second plunger against the inner surface of the housing.

22. The scan arm as claimed in claim 17, wherein the shaft assembly further has a second end opposite to the first end, and the shifting hole fits around the second end.

23. The scan arm as claimed in claim 17, wherein the micro-tilt mechanism further comprises a clamp for fastening the first motors on the bottom.

24. The scan arm as claimed in claim 17, wherein the micro-tilt mechanism further comprises a pair of couplings respectively coupling the lead screws with two first shafts of the first motors.

25. The scan arm as claimed in claim 17, wherein the micro-tilt mechanism further comprises a pair of encoders, the first motors couple to an end of the lead screws, and the encoders fit onto the other end of the lead screws.

26. The scan arm as claimed in claim 16, wherein the first driving mechanism comprises:
a gimbal assembly, fitting around the shaft assembly, so as to provide a tilt center for the shaft assembly; and
a second motor, engaged with the gimbal assembly, so that the second motor is capable of driving the gimbal assembly, the shaft assembly and the ESC to rotate about the twist axis.

27. The scan arm as claimed in claim 26, wherein the gimbal assembly is located between the ESC and the micro-tilt mechanism.

28. The scan arm as claimed in claim 26, wherein the gimbal assembly comprises:
an inner ring, fitting around the shaft assembly;
a middle ring, pivoted around the inner ring by a pair of first pivot shafts; and
an outer ring, fitting within the case body via a bearing and pivoted around the middle ring by a pair of second pivot shafts perpendicular to the first pivot shafts.

29. The scan arm as claimed in claim 16, wherein the case comprises:
a case body, having the first side and a second side opposite to the first side;
a cover, covering the first side, wherein the first driving mechanism is disposed within the case body; and
a housing, covering the second side, wherein the micro-tilt mechanism is disposed within the housing.

30. The scan arm as claimed in claim 16, wherein a second motor of the first driving mechanism is fastened on a bottom of a housing of the case.

31. The scan arm as claimed in claim 16, wherein a center line of the ESC is coincided with the twist axis.

* * * * *